United States Patent
Ou et al.

(10) Patent No.: US 11,150,288 B2
(45) Date of Patent: Oct. 19, 2021

(54) SYSTEM FOR MEASURING CHARGE-TO-MASS RATIO OF ELECTROSTATIC ATOMIZATION NOZZLE AND MEASUREMENT METHOD USING THE SAME

(71) Applicant: Jiangsu University, Jiangsu (CN)

(72) Inventors: Mingxiong Ou, Jiangsu (CN); Minmin Wu, Jiangsu (CN); Weidong Jia, Jiangsu (CN); Chen Gong, Jiangsu (CN); Huitao Zhou, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 17/047,073

(22) PCT Filed: Jul. 30, 2019

(86) PCT No.: PCT/CN2019/098340
§ 371 (c)(1),
(2) Date: Oct. 13, 2020

(87) PCT Pub. No.: WO2020/186682
PCT Pub. Date: Sep. 24, 2020

(65) Prior Publication Data
US 2021/0148961 A1    May 20, 2021

(30) Foreign Application Priority Data
Mar. 15, 2019    (CN) .......................... 201910196052.3

(51) Int. Cl.
*G01R 29/24*    (2006.01)
*B05B 5/025*    (2006.01)

(52) U.S. Cl.
CPC .............. *G01R 29/24* (2013.01); *B05B 5/025* (2013.01)

(58) Field of Classification Search
CPC .................................. G01R 29/24; B05B 5/025
See application file for complete search history.

(56) References Cited

U.S. PATENT DOCUMENTS

| 4,264,641 A * | 4/1981 | Mahoney ................ B05B 5/025 |
| | | 148/403 |
| 4,581,675 A * | 4/1986 | Kelly ..................... B05B 5/025 |
| | | 239/704 |

(Continued)

FOREIGN PATENT DOCUMENTS

| CN | 103149461 | 6/2013 |
| CN | 103439589 | 12/2013 |

(Continued)

OTHER PUBLICATIONS

"International Search Report (Form PCT/ISA/210) of PCT/CN2019/098340," dated Dec. 10, 2019, with English translation thereof, pp. 1-4.

*Primary Examiner* — Tung X Nguyen
*Assistant Examiner* — Feba Pothen
(74) *Attorney, Agent, or Firm* — JCIP Global Inc.

(57) ABSTRACT

The present disclosure discloses a system for measuring a charge-to-mass ratio of an electrostatic atomization nozzle and a measurement method using the same. The system includes an electrostatic atomization nozzle, an upper cylinder, a lower cylinder, an ammeter, a liquid level tube, an ultrasonic level meter, a water storage tank, and a liquid pump. The electrostatic atomization nozzle, the upper cylinder, and the lower cylinder are sequentially connected from top to bottom. The storage tank to the electrostatic atomization nozzle. Measurement data of the ammeter is acquired and processed by a computer in real time.

9 Claims, 4 Drawing Sheets

(56) References Cited

U.S. PATENT DOCUMENTS

| | | | | |
|---|---|---|---|---|
| 7,829,154 | B2* | 11/2010 | Kobayashi | B05B 7/0012 |
| | | | | 427/483 |
| 8,074,640 | B2* | 12/2011 | Davies | A01M 1/2044 |
| | | | | 128/200.14 |
| 10,890,611 | B2* | 1/2021 | Tung | G01R 29/24 |
| 2016/0086785 | A1* | 3/2016 | Chiu | H01J 49/0445 |
| | | | | 250/282 |

FOREIGN PATENT DOCUMENTS

| | | |
|---|---|---|
| CN | 103675486 | 3/2014 |
| CN | 104237974 | 12/2014 |
| CN | 105676010 | 6/2016 |
| CN | 108459213 | 8/2018 |
| CN | 208137933 | 11/2018 |
| CN | 109975623 | 7/2019 |
| JP | H05345905 | 12/1993 |

* cited by examiner

SYSTEM FOR MEASURING CHARGE-TO-MASS RATIO OF ELECTROSTATIC ATOMIZATION NOZZLE AND MEASUREMENT METHOD USING THE SAME

CROSS-REFERENCE TO RELATED APPLICATION

This application is a 371 of international application of PCT application serial no. PCT/CN2019/098340, filed on Jul. 30, 2019, which claims the priority benefit of China application no. 201910196052.3, filed on Mar. 15, 2019. The entirety of each of the above mentioned patent applications is hereby incorporated by reference herein and made a part of this specification.

BACKGROUND

Technical Field

The present disclosure relates to a system for measuring a charge-to-mass ratio of an electrostatic atomization nozzle and a measurement method using the same, and in particular, to a system for measuring a charge-to-mass ratio of an electrostatic atomization nozzle and a measurement method using the same, which are capable of measuring in real time and monitoring the charge-to-mass ratio parameter of the electrostatic atomization nozzle, wherein the measurement system is applicable to real-time measurement and monitoring of the charge-to-mass ratio parameter of the electrostatic atomization nozzle in agricultural plant protection spraying, industrial electrostatic spraying, and other fields.

Description of Related Art

The electrostatic atomization technology is a liquid atomization spraying technology widely applied in agricultural plant protection spraying, electrostatic spraying, electrostatic atomization spray combustion, industrial electrostatic precipitation, and other fields. The electrostatic atomization nozzle developed based on the electrostatic atomization technology features small spray flow, fine particle size, uniform droplets, easy adsorption to the target, good backside adhesion effect, and so on. Especially in the technical field of mechanical pesticide spraying for agricultural plant protection, agricultural plant protection spraying machines using the electrostatic atomization nozzles generally have the advantages of pesticide saving, water saving, high working efficiency, and good pest control effects. Therefore, the electrostatic atomization nozzles are widely used in products such as knapsack sprayers, stretcher-mounted sprayers, mist sprayers, and orchard sprayers. The charge-to-mass ratio parameter is a key indicator of the product performance of the electrostatic atomization nozzles, and has an important influence on the spraying effect of the electrostatic atomization nozzles.

A conventional device for measuring the charge-to-mass ratio mainly uses a Faraday cylinder or grid as a droplet collection component to collect charged droplets sprayed by the nozzle, that is, collects the charged droplets sprayed by the electrostatic atomization nozzle within a period of time (the spray time, generally ranging from dozens of seconds to several minutes) through the Faraday cylinder or grid, measures the total mass of the collected droplets by using a weighing instrument such as a balance, and meanwhile, measures the value of the current produced by the charged droplets flowing through the components such as the Faraday cylinder or grid by using an ammeter, and calculates the charge-to-mass ratio parameter of the nozzle through the value of the current I, the total mass of the droplets m, and the spray time t by using the formula (1):

$$\varepsilon = \frac{c}{m} = \frac{It}{m} \quad (1)$$

wherein $\varepsilon$, in microcoulombs/kilogram, is the charge-to-mass ratio parameter of the electrostatic atomization nozzle; C, in microcoulombs, is the total quantity of electric charges of the charged droplets; I, in microcoulombs/second, is the value of the current produced by the charged droplets flowing through the droplet collection component and measured by the ammeter; m, in kilograms, is the total mass of the droplets sprayed by the electrostatic atomization nozzle; and t, in seconds, is the spray time of the electrostatic atomization nozzle.

The conventional measurement device has the following major problems.

1. Due to insulation and other requirements of an electrostatic spraying system, the conventional measurement device cannot directly measure the spray flow parameter of the electrostatic atomization nozzle through an instrument such as a flowmeter. It mainly adopts a weighing method to measure the total mass of the droplets sprayed by the nozzle during the spray time (ranging from dozens of seconds to several minutes), and uses the spray time to calculate the average charge-to-mass ratio parameter of the electrostatic atomization nozzle during this period of time, which leads to the problems such as long measurement time and slow system response in the conventional measurement method.

2. The conventional measurement method and device require a Faraday cylinder or grid to collect the charged droplets. In order to measure the total mass of the droplets, the charged droplets collected by the Faraday cylinder or grid need to be transferred or guided to a weighing vessel (such as a measuring cylinder). During the transfer of the charged droplets from the Faraday cylinder or grid to the vessel, due to adsorption, evaporation, leakage, and other factors of the liquid on the surface of the Faraday cylinder or grid and the like, loss of the charged droplets is caused during the process of flowing into the vessel, which increases the systematic error in the measurement of the total mass of the droplets, thereby increasing the measurement error of the charge-to-mass ratio parameter and also prolonging the measurement time.

3. The conventional method requires the spray time to calculate the value of the charge-to-mass ratio parameter. However, the existing measurement system still needs much improvement in the on/off control of the spraying system, the stability of the spraying parameter, the measurement of the spray time, and so on. Moreover, some of the spraying systems are manually operated, resulting in a certain error in the measurement of the spray time, which further increases the measurement error of the charge-to-mass ratio parameter.

4. In the conventional measurement device, the liquid flows or is stored in the components such as the electrostatic atomization nozzle, the Faraday cylinder (or grid), the water outlet pipeline, and the weighing vessel. The liquid needs to be handled manually during or after weighing. The components fail to form a closed liquid circulation system, and the liquid sprayed by the electrostatic atomization nozzle cannot be recycled. As for special test liquids or long-term tests, problems such as liquid leakage, contamination, or serious waste may easily occur.

The previous patent documents about devices and methods for measuring the charge-to-mass ratio parameter mainly focus on the conventional devices and methods for measuring the charge-to-mass ratio. The typical patent documents are summarized as follows.

The Chinese patent document with the application number of 201210457633.6 discloses a device for measuring the charge-to-mass ratio in electrostatic spraying. The device consists of a liquid collection cylinder, a measuring cylinder, a precision electronic balance, a picoammeter, and a data acquisition and processing system. The measurement device collects charged droplets through the liquid collection cylinder. The liquid collection cylinder consists of an outer liquid collection cylinder, an inner liquid collection cylinder, and an insulator between the inner and outer cylinders. The liquid inside the liquid collection cylinder is delivered to the measuring cylinder through a hose. The precision electronic balance is used for weighing the total mass of the droplets in the measuring cylinder. The picoammeter is used for current measurement. This measurement device is a conventional device for measuring the charge-to-mass ratio.

The Chinese patent document with the application number of 201310359398.3 discloses an easily disassembled and assembled device for real-time measurement of the charge-to-mass ratio of charged droplets. The device consists of a movable base, a bracket, a support plate, a hanger, an ammeter tray, a balance tray, and a Faraday cylinder. It also collects charged droplets by using the Faraday cylinder and measures the total mass of the droplets by using the balance. Compared with the conventional measurement device, this measurement device can be easily disassembled and moved by means of mechanisms such as the movable base designed in this patent. The content of this patent is an improved design of the conventional measurement device.

The Chinese patent document with the application number of 201310690188.2 discloses an device for measuring the charge-to-mass ratio in boom multi-nozzle electrostatic spraying. The device consists of an L-shaped bracket, a vertical moving platform, a horizontal sliding table, a Faraday cylinder, a precision balance, an ammeter, a lifting mechanism, and so on. It collects charged droplets by using the Faraday cylinder and measures the total mass of the droplets by using the precision balance. By adding horizontal movement and vertical lifting functions to the conventional measurement device, the measurement device of this disclosure is applicable to the measurement of the charge-to-mass ratio in boom multi-nozzle spraying. The content of this patent is also an improved design of the conventional measurement device.

The Chinese patent document with the application number of 201610007625.X discloses a device for measuring the charge-to-mass ratio of droplets in electrostatic spraying. The device mainly consists of a Faraday cylinder, a coulometer, a weight sensor, a water outlet pipeline, a liquid collection barrel, and a computer. It also collects charged droplets by using the Faraday cylinder, delivers the charged droplets in the Faraday cylinder to the liquid collection barrel through the water outlet pipeline, and measures the total mass of the droplets in the liquid collection barrel by using the weight sensor. This device is also a conventional device for measuring the charge-to-mass ratio.

The Chinese patent document with the application number of 201810322387.0 discloses a test stand for the charge-to-mass ratio of droplets in aviation plant protection electrostatic spraying. The test stand consists of a mesh charge-to-mass ratio collection box, a water collection tank, an electrostatic spraying system, a picoammeter, a computer, and so on. It mainly collects charged droplets by using the mesh charge-to-mass ratio collection box. The mesh charge-to-mass ratio collection box has multiple layers of copper meshes. The picoammeter is connected to the copper meshes to measure the current produced by the charged droplets flowing through the copper meshes. The water collection tank of the device gathers the collected droplets to facilitate weighing. The test stand is also a conventional device for measuring the charge-to-mass ratio.

SUMMARY

The charge-to-mass ratio parameter is a key indicator of the performance of an electrostatic atomization nozzle. The conventional device and method for measuring the charge-to-mass ratio have problems such as long measurement time, slow response, and poor accuracy. To improve the real-time performance and accuracy of the system for measuring the charge-to-mass ratio parameter of an electrostatic atomization nozzle, the present disclosure designs a system for measuring a charge-to-mass ratio of an electrostatic atomization nozzle and a measurement method using the same based on the principle of steady free outflow of a liquid flowing through an orifice of a vessel. The system and the method are capable of measuring in real time and monitoring the charge-to-mass ratio parameter of the electrostatic atomization nozzle, and feature high accuracy, rapid response, and the like.

The present disclosure has the following technical solutions:

I. The Structural Solution of the Measurement System

A system for measuring a charge-to-mass ratio of an electrostatic atomization nozzle includes an electrostatic atomization nozzle, an insulating bracket, an upper cylinder, a water retaining ring, a vortex breaker, a flow regulating plate, a lower cylinder, a lower-cylinder water outlet pipe, an ammeter, a metal conducting wire, a liquid level tube, an ultrasonic level meter, a water storage tank, a water supply pipe, a liquid pump, a branch pipeline, a pressure regulating valve, a throttle valve, a filter, a flowmeter, and a computer. The upper cylinder is formed by circumferentially connecting a gradually expanding upper-cylinder end cover and a thin-walled columnar upper-cylinder main body, the lower end of the upper cylinder is an opening, the upper end of the upper cylinder is the upper-cylinder end cover, and an end-cover central hole is provided at the center of the upper-cylinder end cover. The lower cylinder is formed by circumferentially welding a thin-walled columnar lower-cylinder main body and a gradually reducing lower-cylinder bottom cover, the upper end of the lower cylinder is an opening, and the lower end of the lower-cylinder bottom cover is connected to the lower-cylinder water outlet pipe. The upper cylinder and the lower cylinder are connected through an upper-cylinder flange and a lower-cylinder flange, thereby forming an internal cylindrical space with two open ends between the upper cylinder and the lower cylinder. The electrostatic atomization nozzle, the upper cylinder, and the lower cylinder are sequentially connected from top to bottom, and the electrostatic atomization nozzle is mounted in the middle of the end-cover central hole and sprays charged droplets vertically downward. The ammeter is connected to the lower-cylinder flange through the metal conducting wire, and is capable of measuring in real time the current produced by the charged droplets sprayed by the electrostatic atomization nozzle into the lower cylinder. The charged droplets sprayed by the electrostatic atomization nozzle are gathered in the lower cylinder, and under the influence of its own gravity, the liquid flows to the water storage tank through the lower-cylinder water outlet pipe, while the bottom end of the water storage tank is communicated with the water supply pipe and the liquid pump, enabling the liquid in the water storage tank to be delivered by the liquid pump to an inlet of the electrostatic atomization nozzle and again sprayed into the lower cylinder by the electrostatic atomization nozzle. The water supply pipe is communicated with the branch pipeline, and a part of the liquid delivered by the liquid pump flows back to the water storage tank through the branch pipeline. The liquid level tube is L-shaped and consists of a horizontal short tube and a vertical long tube which have thin-walled round tubular structures, the horizontal short tube is communicated with the lower cylinder, and the ultrasonic level meter is mounted on the upper end of the vertical long tube and is capable of measuring in real time the liquid level height in the liquid level tube and the lower cylinder. The ammeter, the ultrasonic level meter, and the flowmeter are connected to the computer through data cables, and the computer acquires and processes in real time measurement data of the ammeter, the ultrasonic level meter, and the flowmeter, thereby achieving real-time measurement and monitoring of the charge-to-mass ratio parameter of the electrostatic atomization nozzle.

The upper cylinder is fixed to a top fixing end through the insulating bracket, and the inner diameter of the upper-cylinder main body is equal to the inner diameter $D_1$ of the lower-cylinder main body. The wall of the upper cylinder is 8-12 millimeters thick. The water retaining ring is of a thin-walled columnar structure coaxial with the upper cylinder and is located in the upper cylinder, and the upper end surface of the water retaining ring is connected to the lower surface of the upper-cylinder end cover. The inner diameter of the water retaining ring is a half of the inner diameter $D_1$ of the lower-cylinder main body, and the water retaining ring is 2-4 millimeters thick. Several end-cover vent holes are provided on the edge of the upper-cylinder end cover, so that the internal cylindrical space formed between the upper cylinder and the lower cylinder is open to the atmosphere, and the end-cover vent holes are uniformly distributed along the circumference of the edge of the upper-cylinder end cover. The insulating bracket, the upper cylinder, and the water retaining ring are made of an insulating material, such as rubber, polyethylene, polypropylene, or polyvinyl chloride.

The vortex breaker and the flow regulating plate are disposed in the lower-cylinder main body, the vortex breaker is of a crossed structure formed by flat steel bars, and the flow regulating plate is of a circular steel plate structure provided with circular flow-through holes. The vortex breaker and the flow regulating plate are sequentially and horizontally arranged in the lower-cylinder main body from top to bottom, and the liquid gathered in the lower cylinder passes through the vortex breaker and the flow regulating plate in the process of flowing downward. The lower-cylinder flange is welded on the upper end surface of the lower-cylinder main body, the lower-cylinder flange and the upper-cylinder flange are matched and fixedly connected with each other, so that the upper cylinder and the lower cylinder are coaxially and fixedly connected, and a gasket is arranged between the lower-cylinder flange and the upper-cylinder flange to prevent leakage of the liquid. The lower cylinder and the lower-cylinder water outlet pipe are made of a metal material such as carbon steel, stainless steel, and aluminum alloys, and the outer surfaces thereof are treated with polymer spraying to improve insulation performance from outside. The walls of the lower cylinder and the lower-cylinder water outlet pipe are 5-8 millimeters thick.

The upper-cylinder main body and the lower-cylinder main body are of thin-walled columnar structures, and the lower-cylinder water outlet pipe is of a columnar short pipe structure, wherein the inner diameter $D_1$ of the lower-cylinder main body ranges from 0.3-0.6 meters, the inner diameter $d_1$ of the lower-cylinder water outlet pipe ranges from 0.001 meter-0.005 meters, and the length $L_1$ of the lower-cylinder water outlet pipe ranges from $4d_1$-$5d_1$, the lower-cylinder main body, the lower-cylinder bottom cover, and the lower-cylinder water outlet pipe are sequentially connected from top to bottom, and the height H of the lower cylinder is designed by using the following formula:

$$H = k_1 \frac{q^2}{g d_1^4}$$

wherein H, in meters, is the height of the lower cylinder; q, in cubic meters/second, is designed spray flow of the measurement system; g, in meters/second squared, is gravitational acceleration; $d_1$, in meters, is the inner diameter of the lower-cylinder water outlet pipe; $k_1$ is modification coefficient, $k_1$=1.6-2.4.

The flow regulating plate of a circular steel plate structure is horizontally arranged in the lower-cylinder main body, a certain number of the circular flow-through holes are provided on the surface of the flow regulating plate, and the diameter $d_2$ of the circular flow-through hole, the number N of the circular flow-through holes, and the inner diameter $D_1$ of the lower-cylinder main body satisfy the following relationship:

$$0.4 << \frac{N d_2^2}{D_1^2} << 0.6$$

wherein $d_2$, in meters, is the diameter of the circular flow-through hole; N is the number of the circular flow-through holes; $D_1$, in meters, is the inner diameter of the lower-cylinder main body.

The liquid level tube is located on the side surface of the lower cylinder and consists of the horizontal short tube and the vertical long tube welded together, the horizontal short tube is horizontally arranged, and the vertical long tube is vertically arranged. A liquid level tube vent hole is provided on the upper end of the vertical long tube, so that the liquid level tube is open to the atmosphere, and meanwhile, the horizontal short tube is communicated with the lower cylinder, thereby forming mutual communication between the liquid level tube, the lower cylinder, and the atmosphere, wherein the center of the liquid level tube vent hole is higher than the end surface of the lower-cylinder flange. The ultrasonic level meter is mounted on the upper end of the vertical long tube, the probe of the ultrasonic level meter faces vertically downward, and the ultrasonic level meter is capable of measuring in real time the liquid level height in the liquid level tube and the lower cylinder. The liquid level tube is made of a metal material such as carbon steel, stainless steel, and aluminum alloys, and the outer surface thereof is treated with polymer spraying. The wall of the liquid level tube is 4-6 millimeters thick and is not thicker than that of the lower cylinder. The ammeter is a microammeter or picoammeter, the input end of the ammeter is connected to the outer surface of the lower-cylinder flange through the metal conducting wire, and the output end of the ammeter is connected to a ground terminal.

The water storage tank is a cylindrical vessel having a closed bottom end and an opening upper end and is located below the lower-cylinder water outlet pipe, the water storage tank is communicated with the inlet of the electrostatic atomization nozzle through the water supply pipe, the liquid pump, the throttle valve, the filter, and the flowmeter, and the flowmeter is located near the inlet of the electrostatic atomization nozzle and acquires in real time the spray flow of the electrostatic atomization nozzle. The water supply pipe is arranged between the liquid pump and the throttle valve and is connected to the branch pipeline. The pressure regulating valve is disposed on the branch pipeline and is capable of being controlled to adjust the output pressure of the liquid pump and the spray pressure of the electrostatic atomization nozzle. An outlet of the branch pipeline faces the opening upper end of the water storage tank, enabling a part of the liquid to flow back to the water storage tank through the branch pipeline and the pressure regulating valve. The water storage tank is made of a metal material such as carbon steel, stainless steel, and aluminum alloys, and the water supply pipe and the branch pipeline are made of an insulating material, such as rubber, polyethylene, polypropylene, or polyvinyl chloride.

II. The Working Principle of the System for Measuring the Charge-to-Mass Ratio

1. The Working Mode of the System for Measuring the Charge-to-Mass Ratio

According to different working states of the electrostatic atomization nozzle and the measurement system, the measurement system has the following two working modes:

The first working mode is used for measuring the charge-to-mass ratio parameter of the electrostatic atomization nozzle of an electrostatic sprayer in a working state, and in this case, the electrostatic sprayer is directly connected to the electrostatic atomization nozzle, the electrostatic atomization nozzle is a part of the electrostatic sprayer, and during the spray test, the electrostatic sprayer provides the electrostatic atomization nozzle with the liquid to be sprayed. When the charge-to-mass ratio parameter of the electrostatic atomization nozzle is measured in the first working mode, the liquid pump, the pressure regulating valve, and the throttle valve are in a closed state.

In the second working mode, the electrostatic atomization nozzle functions as an independent component to be measured and is not connected to the external electrostatic sprayer, the liquid is driven by the liquid pump to flow in closed circulation in the components such as the electrostatic atomization nozzle, the lower cylinder, the lower-cylinder water outlet pipe, the water storage tank, and the water supply pipe, so that the electrostatic atomization nozzle is continuously supplied with the liquid to be sprayed and the proceeding of the spray test is ensured, and meanwhile, the pressure regulating valve is controlled to adjust the output pressure of the liquid pump and the spray pressure of the electrostatic atomization nozzle, to realize measurement of the charge-to-mass ratio parameter under different spray pressures. When the charge-to-mass ratio parameter of the electrostatic atomization nozzle is measured in the second working mode, the liquid pump, the pressure regulating valve, and the throttle valve are in an open state.

2. The Working Principle of the System for Measuring the Charge-to-Mass Ratio

When the electrostatic atomization nozzle is in the first working mode or the second working mode, the charged droplets sprayed downward by the electrostatic atomization nozzle are gathered in the lower cylinder, and under the influence of its own gravity, the liquid gathered in the lower cylinder flows to the water storage tank through the lower-cylinder water outlet pipe, and the charges carried by the charged droplets flow to the ground through the lower cylinder, the metal conducting wire, and the ammeter; therefore, the current produced by the charged droplets sprayed by the electrostatic atomization nozzle into the lower cylinder can be measured in real time by the ammeter. During the initial spray stage, the liquid level in the lower cylinder is low, and the liquid flow from the lower-cylinder water outlet pipe to the water storage tank is smaller than the spray flow of the electrostatic atomization nozzle. With the ongoing of the spray test, the liquid level in the lower cylinder gradually increases, and according to the principle of steady free outflow of a liquid flowing through an orifice of a vessel, the liquid flow from the lower-cylinder water outlet pipe to the water storage tank increases accordingly. When the liquid level in the lower cylinder reaches a certain value, the liquid flow from the lower-cylinder water outlet pipe to the water storage tank is equal to the spray flow of the electrostatic atomization nozzle. In this case, the flow in the lower cylinder is in a steady state, and the liquid level in the lower cylinder and the current value of the ammeter are also in a steady state. According to the principle of steady free outflow of a liquid flowing through an orifice of a vessel, the spray flow Q can be calculated by using the following formula (2):

$$Q=k_0 d_1^2\sqrt{gh} \tag{2}$$

wherein Q, in cubic meters/second, is the spray flow of the electrostatic atomization nozzle; $k_0$ is a flow factor and is a dimensionless number; $d_1$, in meters, is the inner diameter of the lower-cylinder water outlet pipe; g, in meters/second squared, is gravitational acceleration; h, in meters, is the liquid level height in the lower cylinder.

Based on the definition of the charge-to-mass ratio parameter of the electrostatic atomization nozzle, through the formula (2) of calculating the spray flow, the present disclosure calculates the charge-to-mass ratio parameter by using the formula (3):

$$\varepsilon=\frac{c}{m}=1000\frac{1}{\rho Q}=k_1\frac{1}{\rho d_1^2\sqrt{gh}} \tag{3}$$

wherein ε, in microcoulombs/kilogram, is the charge-to-mass ratio parameter of the electrostatic atomization nozzle; C, in microcoulombs, is the total quantity of electric charges of the charged droplets; I, in amperes, is the value of the current produced by the charged droplets flowing through the droplet collection component and measured by the ammeter; m, in kilograms, is the total mass of the droplets sprayed by the electrostatic atomization nozzle; Q, in cubic meters/second, is the spray flow of the electrostatic atomization nozzle; ρ, in kilograms/cubic meter, is the density of the liquid to be sprayed by the electrostatic atomization nozzle; $k_1$ is modification coefficient, $k_1=1000/k_0$, $k_0$ is a flow factor and is a dimensionless number; $d_1$, in meters, is the inner diameter of the lower-cylinder water outlet pipe; g, in meters/second squared, is gravitational acceleration; h, in meters, is the liquid level height in the lower cylinder.

It can be seen from the above that, the liquid level height in the lower cylinder can be measured by using the ultrasonic level meter, and based on the principle of steady free outflow of a liquid flowing through an orifice of a vessel, the spray flow can be calculated indirectly. Meanwhile, the value of the current produced by the charged droplets sprayed by the electrostatic atomization nozzle into the lower cylinder is measured by the ammeter. Based on this, the charge-to-mass ratio parameter of the electrostatic atomization nozzle can be acquired through the spray flow and the current value, thereby achieving real-time measurement and monitoring of the charge-to-mass ratio parameter of the electrostatic atomization nozzle.

III. The Measurement Method of the System for Measuring the Charge-to-Mass Ratio 1. The Methods for Acquiring Measurement Data According to the working modes of the measurement system, two methods for acquiring measurement data are provided as follows:

(1) The Method for Acquiring Measurement Data in the First Working Mode

When the measurement system is in the first working mode, the computer acquires in real time the measurement data of the ammeter and the ultrasonic level meter, and the specific measurement method includes the following steps:

during the spray test of the electrostatic atomization nozzle, acquiring, by the computer, in real time data of the current I output by the ammeter according to a sampling period $T_1$ of the ammeter, and acquiring in real time data of the liquid level height h output by the ultrasonic level meter according to a sampling period $T_2$ of the ultrasonic level meter, the sampling duration of the computer being t1 ranging from 30T-50T, wherein T is a larger value of $T_1$ and $T_2$;

during the system test, acquiring, by the computer, the data of the current I and the liquid level height h within the sampling duration t1 to respectively generate arrays $I1=[I1_1, I1_2, \ldots, I1_n]$ and $h1=[h1_1, h1_2, \ldots, h1_n]$; firstly calculating, by the computer, coefficients of fluctuation $$S1_{h1} = \frac{\max(h1) - \min(h1)}{\overline{h1}} \text{ and } S2_{h1} = \left|\frac{h1_m}{\overline{h1}}\right|$$

of the array h1, wherein max(h1) is the maximum value in the array h1, min(h1) is the minimum value in the array h1, $$\overline{h1} = \frac{\sum_{i=1}^{n} h1_i}{n},$$

and $h1_m$ is the median of the array h1;

when the coefficients of fluctuation $S1_{h1}$ and $S2_{h1}$ satisfy both the conditions $S1_{h1} \leq 6\%$ and $97\% \leq S2_{h1} \leq 103\%$, processing, by the computer, the arrays I1 and h1, respectively acquiring through calculation the mean values of the $$\overline{I1} = \frac{\sum_{i=1}^{n} I1_i}{n} \text{ and } \overline{h1} = \frac{\sum_{i=1}^{n} h1_i}{n}$$

of the arrays I1 and h1, and outputting $\overline{I1}$ and $\overline{h1}$ as the real-time current value and the real-time liquid level height of this spray test respectively;

when the coefficients of fluctuation $S1_{h1}$ and $S2_{h1}$ fail to satisfy both the conditions $S1_{h1} \leq 6\%$ and $97\% \leq S2_{h1} \leq 103\%$, still outputting, by the computer, $\overline{I1}$ and $\overline{h1}$ as the real-time current value and the real-time liquid level height of this spray test respectively, and meanwhile, outputting the coefficients of fluctuation $S1_{h1}$ and $S2_{h1}$ synchronously for the reference of testers.

(2) The Method for Acquiring Measurement Data in the Second Working Mode

When the measurement system is in the second working mode, the computer acquires in real time the measurement data of the ammeter, the ultrasonic level meter, and the flowmeter, and the specific measurement method includes the following steps:

during the spray test of the electrostatic atomization nozzle, acquiring, by the computer, in real time data of the current I output by the ammeter according to the sampling period $T_1$ of the ammeter, acquiring in real time data of the liquid level height h output by the ultrasonic level meter according to the sampling period $T_2$ of the ultrasonic level meter, and acquiring in real time data of the spray flow q output by the flowmeter according to a sampling period $T_3$ of the flowmeter, the sampling duration of the computer being t2 ranging from 30T-50T, wherein T is the maximum value of $T_1$, $T_2$, and $T_3$;

during the system test, acquiring, by the computer, the data of the current I, the liquid level height h, and the spray flow q within the sampling duration t2 to respectively generate arrays $I2=[I2_1, I2_2, \ldots, I2_n]$, $h2=[h2_1, h2_2, \ldots, h2_n]$, and $q1=[q1_1, q1_2, \ldots, q1_n]$; firstly calculating, by the computer, coefficients of fluctuation $$S1_{h2} = \frac{\max(h2) - \min(h2)}{\overline{h2}}, S2_{h2} = \left|\frac{h2_m}{\overline{h2}}\right|,$$

$$S1_{q1} = \frac{\max(q1) - \min(q1)}{\overline{q1}}, \text{ and } S2_{q1} = \left|\frac{q1_m}{\overline{q1}}\right|$$

of the arrays h2 and q1, wherein max(h2) is the maximum value in the array h2, min(h2) is the minimum value in the array h2, $$\overline{h2} = \frac{\sum_{i=1}^{n} h2_i}{n}$$

and $h2_m$ is the median of the array h2, max(q1) is the maximum value in the array q1, min(q1) is the minimum value in the array q1, $$\overline{q1} = \frac{\sum_{i=1}^{n} q1_i}{n}$$

and $q1_m$ is the median of the array q1;

when the coefficients of fluctuation $S1_{h2}$, $S2_{h2}$, $S1_{q1}$, and $S2_{q1}$ satisfy all the conditions $S1_{h2} \leq 6\%$, $97\% \leq S2_{h2} \leq 103\%$, $S1_{q1} \leq 3\%$, and $98\% \leq S2_{q1} \leq 102\%$, processing, by the computer, the arrays I2 and h2, respectively acquiring through calculation the mean values $$\overline{I2} = \frac{\sum_{i=1}^{n} I2_i}{n} \text{ and } \overline{h2} = \frac{\sum_{i=1}^{n} h2_i}{n}$$

of the arrays I2 and h2, and outputting $\overline{I2}$ and $\overline{h2}$ as the real-time current value and the real-time liquid level height of this spray test respectively;

when the coefficients of fluctuation $S1_{h2}$, $S2_{h2}$, $S1_{q1}$, and $S2_{q1}$ fail to satisfy all the conditions $S1_{h2} \leq 6\%$, $97\% \leq S2_{h2} \leq 103\%$, $S1_{q1} \leq 3\%$, and $98\% \leq S2_{q1} \leq 102\%$, still outputting, by the computer, $\overline{I2}$ and $\overline{h2}$ as the real-time current value and the real-time liquid level height of this spray test respectively, and meanwhile, outputting the coefficients of fluctuation $S1_{h2}$, $S2_{h2}$, $S1_{q1}$, and $S2_{q1}$ synchronously for the reference of testers.

2. The Method for Measuring and Calculating the Charge-to-Mass Ratio Parameter

When the measurement system is in the first working mode or the second working mode, the computer system calculates the charge-to-mass ratio parameter of the electrostatic atomization nozzle according to the real-time current value and the real-time liquid level height output in the spray test, and it can be seen from the calculation formula (3) that, the charge-to-mass ratio parameter is specifically calculated by using the following formula:

$$\varepsilon = k_1 \frac{\overline{I1}}{\rho d_1^2 \sqrt{g \overline{h1}}} = k_1 \frac{\overline{I2}}{\rho d_1^2 \sqrt{g \overline{h2}}}$$

wherein ε, in microcoulombs/kilogram, is the charge-to-mass ratio parameter of the electrostatic atomization nozzle; ρ, in kilograms/cubic meter, is the density of the liquid to be sprayed by the electrostatic atomization nozzle; $d_1$, in meters, is the inner diameter of the lower-cylinder water outlet pipe; g, in meters/second squared, is gravitational acceleration; $k_1$ is modification coefficient, $k_1$=1080-1120; $\overline{I1}$ and $\overline{I2}$, in amperes, are real-time current values during the test of the measurement system; $\overline{h1}$ and $\overline{h2}$, in meters, are real-time liquid level heights during the test of the measurement system.

Compared with the conventional device and method for measuring the charge-to-mass ratio parameter in the prior art, the system for measuring the charge-to-mass ratio of an electrostatic atomization nozzle and the measurement method using the same provided by the present disclosure have the following features:

(1) Based on the principle of steady free outflow of a liquid flowing through an orifice of a vessel, the present disclosure designs the measurement system capable of acquiring in real time the spray flow of an electrostatic atomization nozzle. The system adopts the upper cylinder and the lower cylinder as droplet collection components, and by means of the components such as the lower cylinder, the liquid level tube, and the ultrasonic level meter, measures in real time the liquid level height in the lower cylinder to indirectly measure the spray flow of the electrostatic atomization nozzle, thereby realizing external real-time measurement of the spray flow of the electrostatic atomization nozzle, so that the spray flow does not need to be measured by mounting a flowmeter in the electrostatic sprayer or the like.

(2) The measurement system provided by the present disclosure adopts the upper cylinder and the lower cylinder as droplet collection components, and realizes real-time measurement of the spray flow directly through the components such as the liquid level tube and the ultrasonic level meter on the side surface of the lower cylinder. The charged droplets do not need to be transferred or guided to other vessels for weighing during the test. Therefore, the test process is simpler, and the measurement errors caused by factors such as adsorption, evaporation, and leakage during the transfer or guidance of the charged droplets are eliminated.

(3) By using the value of the current I and the spray flow Q, the measurement system provided by the present disclosure can directly acquire through calculation the charge-to-mass ratio parameter of the electrostatic atomization nozzle. Since the sampling duration of the measurement system (several milliseconds to dozens of milliseconds) is very short, the measurement system has good real-time performance. Meanwhile, the method for measuring the charge-to-mass ratio based on the calculation formula (3) eliminates the spray time in the conventional measurement method, thereby reducing sources of errors and simplifying the test process.

(4) In the measurement system provided by the present disclosure, the electrostatic atomization nozzle, the lower cylinder, the lower-cylinder water outlet pipe, the water storage tank, the water supply pipe, the liquid pump, the pressure regulating valve, and other components form a closed liquid circulation system, realizing closed circulation of the liquid in the measurement system. When the electrostatic atomization nozzle functions as an independent component to be measured and is not connected to the external electrostatic sprayer, the measurement system can provide a liquid having a certain spray pressure for continuous spray of the electrostatic atomization nozzle, the liquid can be recycled in the measurement system, the problems such as liquid leakage and contamination may not be easily caused, and advantages such as adjustable spray pressure are also achieved.

BRIEF DESCRIPTION OF THE DRAWINGS

The present disclosure is further described below with reference to the accompanying drawings and specific embodiments.

In the drawings, 1. electrostatic atomization nozzle, 2. insulating bracket, 3. upper cylinder, 4. water retaining ring, 5. vortex breaker, 6. flow regulating plate, 7. lower cylinder, 8. lower-cylinder water outlet pipe, 9. ammeter, 10. metal conducting wire, 11. liquid level tube, 12. ultrasonic level meter, 13. water storage tank, 14. water supply pipe, 15. liquid pump, 16. branch pipeline, 17. pressure regulating valve, 18. throttle valve, 19. filter, 20. flowmeter, 21. water supply pipe of an electrostatic sprayer, 22. end-cover central hole, 23. upper-cylinder end cover, 24. end-cover vent hole, 25. upper-cylinder main body, 26. upper-cylinder flange, 27. lower-cylinder flange, 28. lower-cylinder main body, 29. lower-cylinder bottom cover, 30. inner diameter $D_1$ of the lower-cylinder main body, 31. height H of the lower cylinder, 32. inner diameter $d_1$ of the lower-cylinder water outlet pipe, 33. length $L_1$ of the lower-cylinder water outlet pipe, 34. horizontal short tube, 35. vertical long tube, 36. liquid level tube vent hole, 37. circular flow-through hole, 38. diameter $d_2$ of the circular flow-through hole.

DESCRIPTION OF THE EMBODIMENTS

FIG. 1 to FIG. 4 show the structure of an embodiment of the measurement system. In this embodiment, the spray flow is designed to be q=1.2 liters/minute=2×10$^{-5}$ cubic meters/second. The system for measuring the charge-to-mass ratio of an electrostatic atomization nozzle and the measurement method using the same provided by the present disclosure are described clearly and completely below with reference to the accompanying drawings of the embodiment of the present disclosure.

FIG. 1 and FIG. 2 are schematic views of the system for measuring the charge-to-mass ratio of an electrostatic atomization nozzle provided by the embodiment of the present disclosure. The measurement system consists of an electrostatic atomization nozzle 1, an insulating bracket 2, an upper cylinder 3, a water retaining ring 4, a vortex breaker 5, a flow regulating plate 6, a lower cylinder 7, a lower-cylinder water outlet pipe 8, an ammeter 9, a metal conducting wire 10, a liquid level tube 11, an ultrasonic level meter 12, a water storage tank 13, a water supply pipe 14, a liquid pump 15, a branch pipeline 16, a pressure regulating valve 17, a throttle valve 18, a filter 19, a flowmeter 20, and a computer. The upper cylinder 3 consists of a gradually expanding upper-cylinder end cover 23 and a thin-walled columnar upper-cylinder main body 25. The lower end of the upper cylinder 3 is an opening, and the upper end of the upper cylinder 3 is the upper-cylinder end cover 23. An end-cover central hole 22 is provided at the center of the upper-cylinder end cover 23. The lower cylinder 7 is formed by circumferentially welding a thin-walled columnar lower-cylinder main body 28 and a gradually reducing lower-cylinder bottom cover 29. The upper end of the lower cylinder 7 is an opening. The lower end of the lower-cylinder bottom cover 29 is connected to the lower-cylinder water outlet pipe 8. The upper cylinder 3 and the lower cylinder 7 are vertically connected through an upper-cylinder flange 26 and a lower-cylinder flange 27, thereby forming an internal cylindrical space with two open ends between the upper cylinder 3 and the lower cylinder 7. The electrostatic atomization nozzle 1, the upper cylinder 3, and the lower cylinder 7 are vertically and sequentially connected from top to bottom. The electrostatic atomization nozzle 1 is mounted in the middle of the end-cover central hole 22, and sprays charged droplets vertically downward. The ammeter 9 is connected to the lower-cylinder flange 27 through the metal conducting wire 10. The charged droplets sprayed by the electrostatic atomization nozzle 1 are gathered in the lower cylinder 7. Under the influence of its own gravity, the liquid flows to the water storage tank 13 through the lower-cylinder water outlet pipe 8. The bottom end of the water storage tank 13 is communicated with the water supply pipe 14 and the liquid pump 15, enabling the liquid in the water storage tank 13 to be delivered by the liquid pump 15 to an inlet of the electrostatic atomization nozzle 1 and again sprayed into the lower cylinder 7 by the electrostatic atomization nozzle 1. The water supply pipe 14 is communicated with the branch pipeline 16. A part of the liquid delivered by the liquid pump 15 flows back to the water storage tank 13 through the branch pipeline 16. The liquid level tube 11 is L-shaped and consists of a horizontal short tube 34 and a vertical long tube 35 which have thin-walled round tubular structures. The horizontal short tube 34 is communicated with the lower cylinder 7. The ultrasonic level meter 12 is mounted on the upper end of the vertical long tube 35 and is capable of measuring in real time the liquid level height in the liquid level tube 11 and the lower cylinder 7. The ammeter 9, the ultrasonic level meter 12, and the flowmeter 20 are connected to the computer through data cables. The computer acquires and processes in real time measurement data of the ammeter 9, the ultrasonic level meter 12, and the flowmeter 20, thereby achieving real-time measurement and monitoring of the charge-to-mass ratio parameter of the electrostatic atomization nozzle 1.

As shown in FIG. 1, the insulating bracket 2 is fixedly connected between the upper-cylinder end cover 23 and a top fixing end, and thus the upper cylinder 3 is fixed to the top fixing end through the insulating bracket 2. The inner diameter of the upper-cylinder main body 25 is equal to the inner diameter $D_1$ of the lower-cylinder main body. The inner diameter of the upper-cylinder main body 25 is 0.4 meters, and the wall of the upper cylinder 3 is 8 millimeters thick. The water retaining ring 4 is of a thin-walled columnar structure coaxial with the upper cylinder 3, and is located in the upper cylinder 3. The upper end surface of the water retaining ring 4 is connected to the lower surface of the upper-cylinder end cover 23. The inner diameter of the water retaining ring 4 is 0.2 meters, ensuring that the charged droplets sprayed by the electrostatic atomization nozzle 1 may not directly hit the inner surface of the water retaining ring 4. The water retaining ring 4 is 2 millimeters thick. Several end-cover vent holes 24 are provided on the edge of the upper-cylinder end cover 23, so that the internal cylindrical space formed between the upper cylinder 3 and the lower cylinder 7 is open to the atmosphere. The end-cover vent holes 24 are uniformly distributed along the circumference of the edge of the upper-cylinder end cover 23. The inner diameter of the end-cover vent hole 24 is 10 millimeters, and the number of the end-cover vent holes 24 is 12. The insulating bracket 2, the upper cylinder 3, and the water retaining ring 4 are made of an insulating material, such as rubber, polyethylene, polypropylene, or polyvinyl chloride.

As shown in FIG. 2, the vortex breaker 5 and the flow regulating plate 6 are disposed in the lower-cylinder main body 28. As shown in FIG. 3, the vortex breaker 5 is of a crossed structure formed by flat steel bars. As shown in FIG. 4, the flow regulating plate 6 is of a circular steel plate structure provided with circular flow-through holes 37. As shown in FIG. 2, the vortex breaker 5 and the flow regulating plate 6 are sequentially and horizontally arranged in the lower-cylinder main body 28 from top to bottom. The liquid gathered in the lower cylinder 7 passes through the vortex breaker 5 and the flow regulating plate 6 in the process of flowing downward. The lower-cylinder flange 27 is welded on the upper end surface of the lower-cylinder main body 28. The lower-cylinder flange 27 and the upper-cylinder flange 26 are matched and fixedly connected with each other, so that the upper cylinder 3 and the lower cylinder 7 are fixedly connected. A gasket is arranged between the lower-cylinder flange 27 and the upper-cylinder flange 26 to prevent leakage of the liquid. The lower cylinder 7 and the lower-cylinder water outlet pipe 8 are made of a metal material such as carbon steel, stainless steel, and aluminum alloys, and the outer surfaces thereof are treated with polymer spraying to improve insulation performance from outside. The walls of the vortex breaker 5, the flow regulating plate 6, the lower cylinder 7, and the lower-cylinder water outlet pipe 8 are all 6 millimeters thick.

Figure 2:
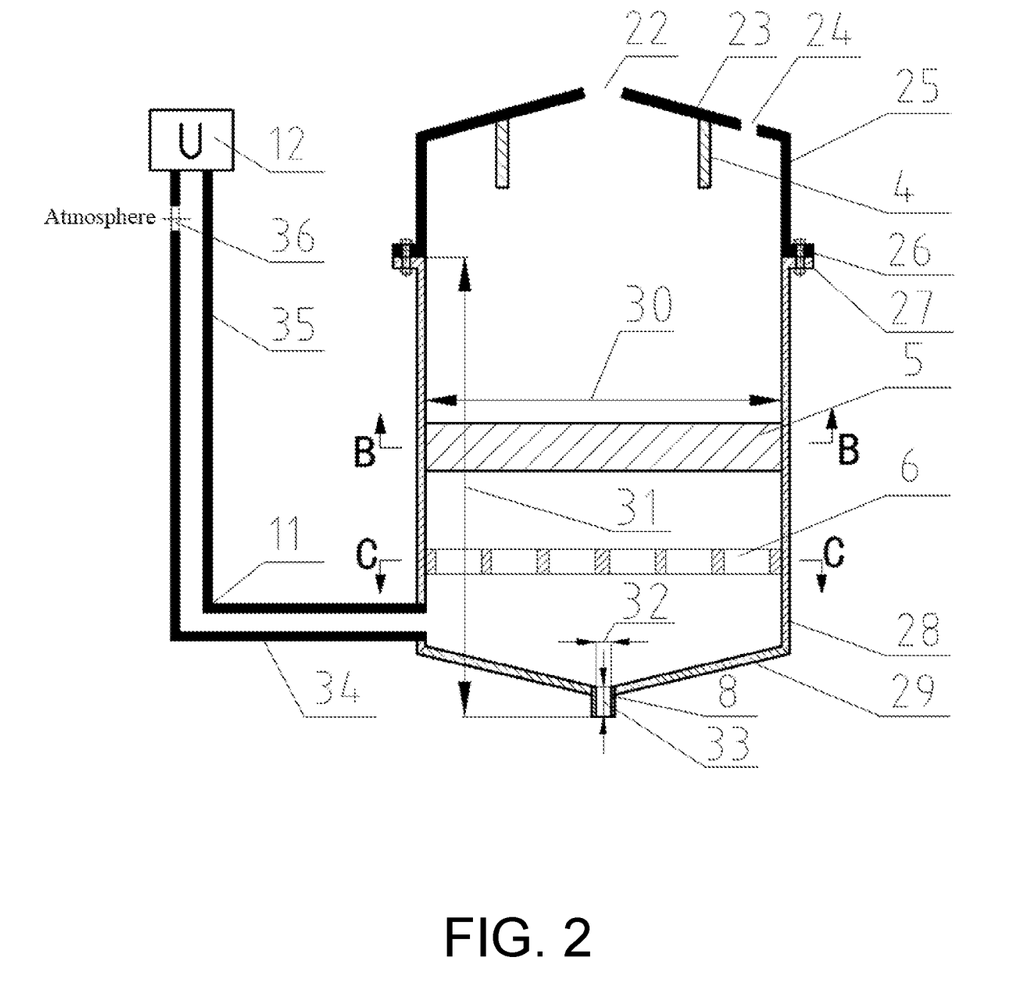
FIG. 2 is a partial cross-sectional view of the same embodiment, which includes components such as an upper cylinder, a lower cylinder, and a liquid level tube.
Figure 3:
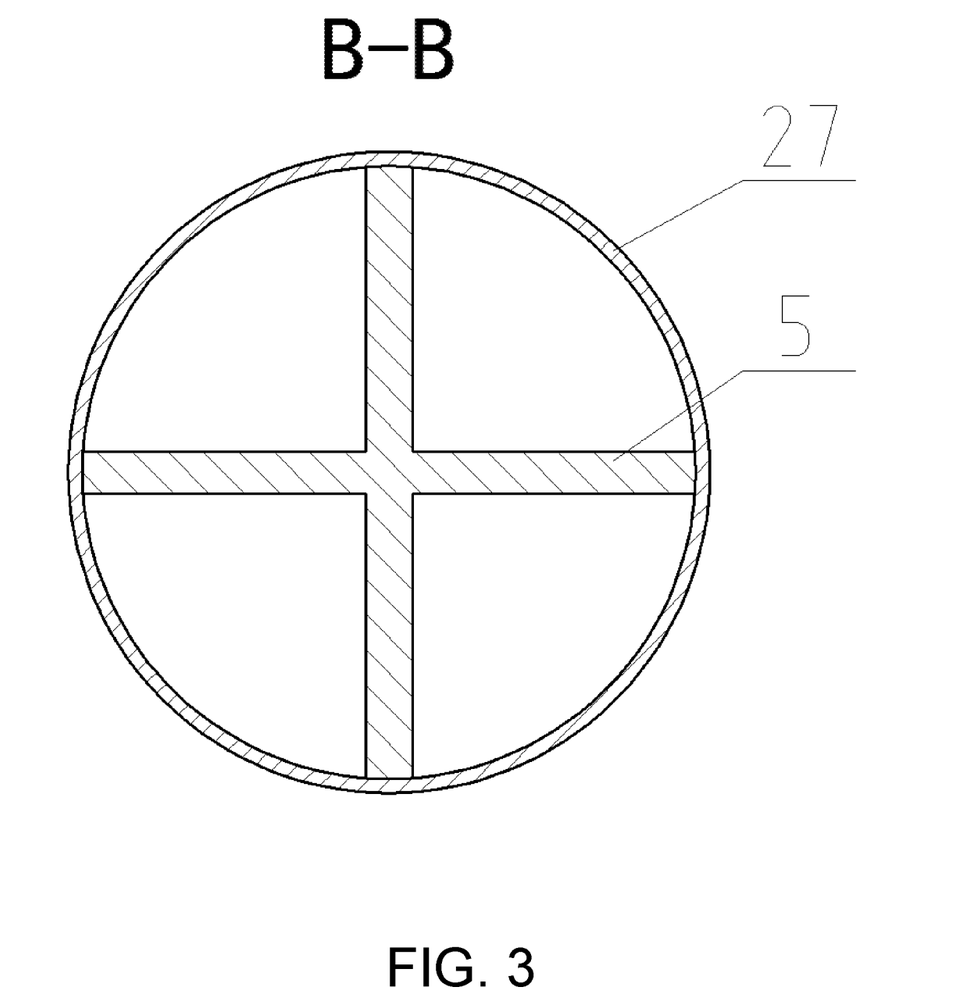
FIG. 3 is a radial cross-sectional view of a vortex breaker in the same embodiment.

As shown in FIG. 2, the upper-cylinder main body 25 and the lower-cylinder main body 28 are of thin-walled columnar structures. The inner diameter $D_1$ of the lower-cylinder main body is 0.4 meters. The lower-cylinder water outlet pipe 8 is of a columnar short pipe structure, the inner diameter $d_1$ of the lower-cylinder water outlet pipe is 0.0035 meters, and the length $L_1$ of the lower-cylinder water outlet pipe is 0.015 meters. The height H of the lower cylinder is designed by using the following formula:

$$H = k_1 \frac{q^2}{g d_1^4}$$

wherein H, in meters, is the height of the lower cylinder; q, in cubic meters/second, is designed spray flow of the measurement system; g, in meters/second squared, is gravitational acceleration and the value thereof in this embodiment is 9.81 meters/second squared; $d_1$, in meters, is the inner diameter of the lower-cylinder water outlet pipe; $k_1$ is modification coefficient, $k_1=1.6$-$2.4$. According to the above design formula, the height H of the lower cylinder in this embodiment ranges from 0.44-0.65 meters, and the height H of the lower cylinder is finally determined to be 0.5 meters.

Figure 4:
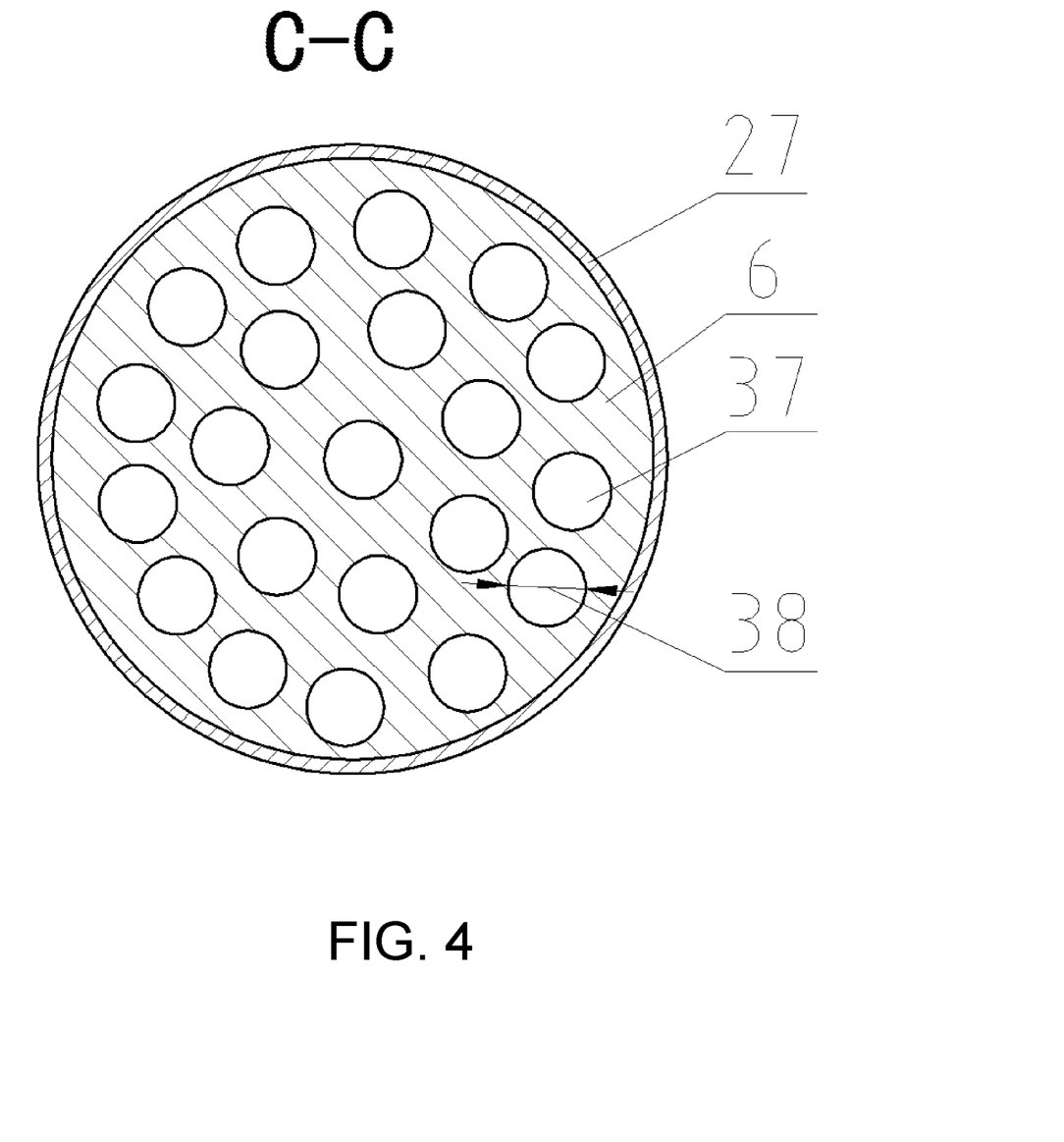
FIG. 4 is a radial cross-sectional view of a flow regulating plate in the same embodiment.

As shown in FIG. 4, the flow regulating plate 6 of a circular steel plate structure is horizontally arranged in the lower-cylinder main body 28. A certain number of the circular flow-through holes 37 are provided on the surface of the flow regulating plate 6 and are distributed at equal intervals. The diameter $d_2$ of the circular flow-through hole, the number N of the circular flow-through holes, and the inner diameter $D_1$ of the lower-cylinder main body satisfy the following relationship:

$$0.4 << \frac{N d_2^2}{D_1^2} << 0.6$$

wherein $d_2$, in meters, is the diameter of the circular flow-through hole; N is the number of the circular flow-through holes; and $D_1$, in meters, is the inner diameter of the lower-cylinder main body. In this embodiment, the inner diameter $D_1$ of the lower-cylinder main body is 0.4 meters, the diameter $d_2$ of the circular flow-through hole is 60 millimeters, and the number N of the circular flow-through holes is 21, which meet the above design requirement.

As shown in FIG. 2, the liquid level tube 11 is located on the side surface of the lower cylinder 7, and consists of the horizontal short tube 34 and the vertical long tube 35 welded together. The horizontal short tube 34 is horizontally arranged, and the vertical long tube 35 is vertically arranged. The inner diameters of the horizontal short tube 34 and the vertical long tube 35 are 0.1 meter, and the walls thereof are 6 millimeters thick. A liquid level tube vent hole 36 is provided on the upper end of the vertical long tube 35, so that the liquid level tube 11 is open to the atmosphere, and meanwhile, the horizontal short tube 34 is communicated with the lower cylinder 7, thereby forming mutual communication between the liquid level tube 11, the lower cylinder 7, and the atmosphere. The center of the liquid level tube vent hole 36 is higher than the end surface of the lower-cylinder flange 27. The diameter of the liquid level tube vent hole 36 is 50 millimeters. The ultrasonic level meter 12 is mounted on the upper end of the vertical long tube 35, and the probe of the ultrasonic level meter 12 faces vertically downward. The ultrasonic level meter 12 is capable of measuring in real time the liquid level height in the liquid level tube 11 and the lower cylinder 7. The liquid level tube 11 is made of a metal material such as carbon steel, stainless steel, and aluminum alloys, and the outer surface thereof is treated with polymer spraying. The ammeter 9 is a microammeter or picoammeter. The input end of the ammeter 9 is connected to the outer surface of the lower-cylinder flange 27 through the metal conducting wire 10, and the output end of the ammeter 9 is connected to a ground terminal.

As shown in FIG. 2, the water storage tank 13 is a cylindrical vessel having a closed bottom end and an opening upper end, and is located below the lower-cylinder water outlet pipe 8. The water storage tank 13 is communicated with the inlet of the electrostatic atomization nozzle 1 through the water supply pipe 14, the liquid pump 15, the throttle valve 18, the filter 19, and the flowmeter 20. The flowmeter 20 is located near the inlet of the electrostatic atomization nozzle 1, and acquires in real time the spray flow of the electrostatic atomization nozzle 1. The liquid in the water storage tank 13 is driven by the liquid pump 15 to flow through the water supply pipe 14, the throttle valve 18, the filter 19, the flowmeter 20, and the electrostatic atomization nozzle 1, is then sprayed by the electrostatic atomization nozzle 1 into the lower cylinder 7, and again flows to the water storage tank 13 through the lower-cylinder water outlet pipe 8; therefore, the liquid flows in closed circulation in the measurement system. The water supply pipe 14 is arranged between the liquid pump 15 and the throttle valve 18 and is connected to the branch pipeline 16. The pressure regulating valve 17 is disposed on the branch pipeline 16 and is capable of being controlled to adjust the output pressure of the liquid pump 15 and the spray pressure of the electrostatic atomization nozzle 1. An outlet of the branch pipeline 16 is located above the water storage tank 13, and faces the opening upper end of the water storage tank 13, enabling a part of the liquid to flow back to the water storage tank 13 through the branch pipeline 16 and the pressure regulating valve 17. The water storage tank 13 is made of a metal material such as carbon steel, stainless steel, and aluminum alloys. The water supply pipe 14 and the branch pipeline 16 are made of an insulating material, such as rubber, polyethylene, polypropylene, or polyvinyl chloride.

Figure 1:
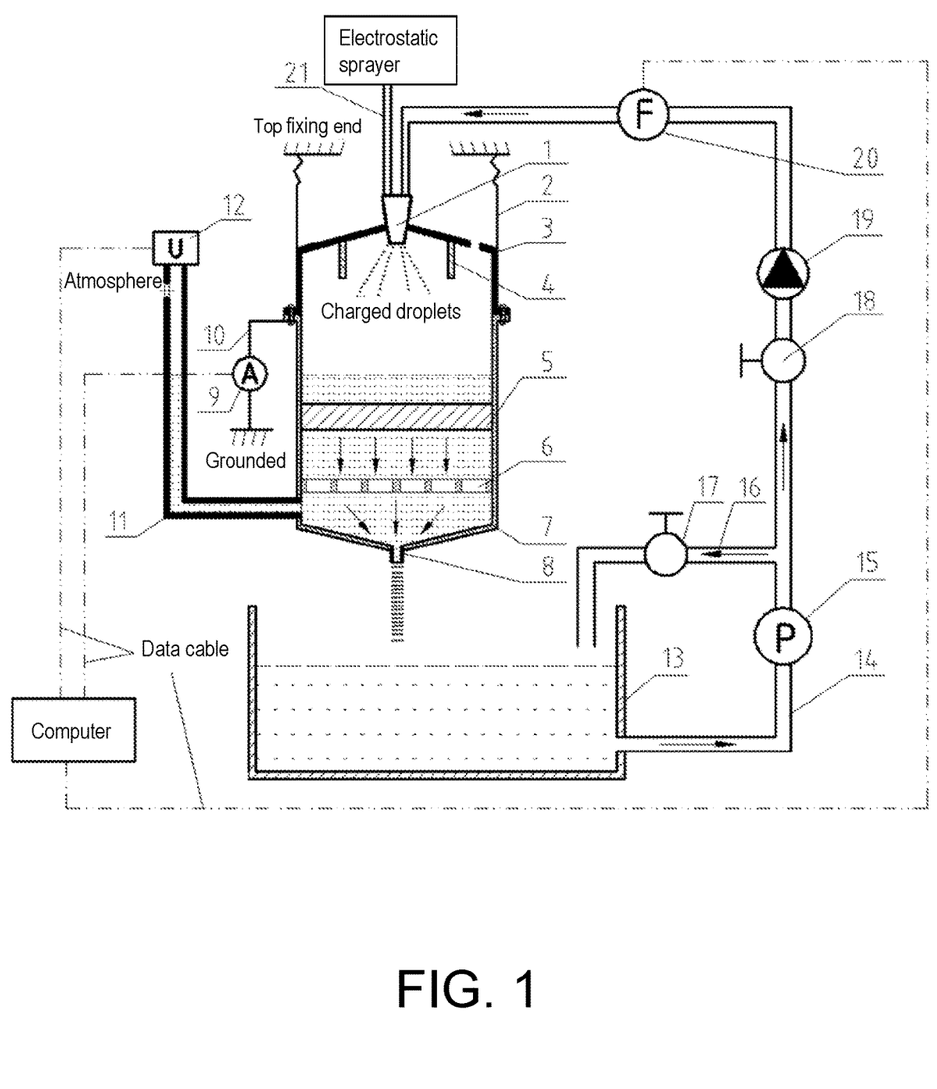
FIG. 1 is a schematic structural view of an overall solution according to an embodiment of the present disclosure.

As shown in FIG. 1, the measurement system has two working modes.

The first working mode is used for measuring the charge-to-mass ratio parameter of the electrostatic atomization nozzle 1 of an electrostatic sprayer in a working state. In this case, the electrostatic atomization nozzle 1 is directly connected to the electrostatic sprayer, and the external electrostatic sprayer provides the electrostatic atomization nozzle 1 with the liquid to be sprayed. The electrostatic atomization nozzle 1 is a part of the electrostatic sprayer. When the charge-to-mass ratio parameter of the electrostatic atomization nozzle 1 is measured in the first working mode, the liquid pump 15, the pressure regulating valve 17, and the throttle valve 18 are in a closed state, the computer only acquires measurement data of the ammeter 9 and the ultrasonic level meter 12, and the liquid does not flow in closed circulation in the measurement system.

In the second working mode, the electrostatic atomization nozzle 1 functions as an independent component to be measured, and is not connected to the external electrostatic sprayer. Driven by the liquid pump 15, the liquid flows in closed circulation in the components such as the electrostatic atomization nozzle 1, the lower cylinder 7, the lower-cylinder water outlet pipe 8, the water storage tank 13, and the water supply pipe 14, so that the electrostatic atomization nozzle 1 is continuously supplied with the liquid to be sprayed and the proceeding of the spray test is ensured. When the charge-to-mass ratio parameter of the electrostatic atomization nozzle 1 is measured in the second working mode, the liquid pump 15, the pressure regulating valve 17, and the throttle valve 18 are in an open state, and the computer acquires measurement data of the ammeter 9, the ultrasonic level meter 12, and the flowmeter 20 at the same time.

When the measurement system is in the first working mode, the computer acquires in real time the measurement data of the ammeter and the ultrasonic level meter. The specific measurement method includes the following steps.

During the spray test of the electrostatic atomization nozzle 1, the computer acquires in real time data of the current I output by the ammeter 9 according to a sampling period $T_1$ of the ammeter, and acquires in real time data of the liquid level height h output by the ultrasonic level meter 12 according to a sampling period $T_2$ of the ultrasonic level meter. The sampling duration of the computer is t1 ranging from 30T-50T, wherein T is a larger value of $T_1$ and $T_2$.

During the system test, the computer acquires the data of the current I and the liquid level height h within the sampling duration t1 to respectively generate arrays $I1=[I1_1, I1_2, \ldots, I1_n]$ and $h1=[h1_1, h1_2, \ldots, h1_n]$. The computer firstly calculates coefficients of fluctuation $$S1_{h1} = \frac{\max(h1) - \min(h1)}{\overline{h1}} \text{ and } S2_{h1} = \left|\frac{h1_m}{\overline{h1}}\right|$$

of the array h1, wherein max(h1) is the maximum value in the array h1, min(h1) is the minimum value in the array h1, $$\overline{h1} = \frac{\sum_{i=1}^{n} h1_i}{n},$$

and $h1_m$ is the median of the array h1.

When the coefficients of fluctuation $S1_{h1}$ and $S2_{h1}$ satisfy both the conditions $S1_{h1} \leq 6\%$ and $97\% \leq S2_{h1} \leq 103\%$, the computer processes the arrays I1 and h1, respectively acquires through calculation the mean values $$\overline{I1} = \frac{\sum_{i=1}^{n} I1_i}{n} \text{ and } \overline{h1} = \frac{\sum_{i=1}^{n} h1_i}{n}$$

of the arrays I1 and h1, and outputs $\overline{I1}$ and $\overline{h1}$ as the real-time current value and the real-time liquid level height of this spray test respectively. When the coefficients of fluctuation $S1_{h1}$ and $S2_{h1}$ fail to satisfy both the conditions $S1_{h1} \leq 6\%$ and $97\% \leq S2_{h1} \leq 103\%$, the computer still outputs $\overline{I1}$ and $\overline{h1}$ as the real-time current value and the real-time liquid level height of this spray test respectively, and meanwhile, outputs the coefficients of fluctuation $S1_{h1}$ and $S2_{h1}$ synchronously for the reference of testers.

When the measurement system is in the second working mode, the computer acquires in real time the measurement data of the ammeter, the ultrasonic level meter, and the flowmeter. The specific measurement method includes the following steps.

During the spray test of the electrostatic atomization nozzle 1, the computer acquires in real time data of the current I output by the ammeter 9 according to the sampling period $T_1$ of the ammeter, acquires in real time data of the liquid level height h output by the ultrasonic level meter 12 according to the sampling period $T_2$ of the ultrasonic level meter, and acquires in real time data of the spray flow q output by the flowmeter 20 according to a sampling period $T_3$ of the flowmeter. The sampling duration of the computer is t2 ranging from 30T-50T, wherein T is the maximum value of $T_1$, $T_2$, and $T_3$.

During the system test, the computer acquires the data of the current I, the liquid level height h, and the spray flow q within the sampling duration t2 to respectively generate arrays $I2=[I2_1, I2_2, \ldots, I2_n]$, $h2=[h2_1, h2_2, \ldots, h2_n]$, and $q1=[q1_1, q1_2, \ldots, q1_n]$. The computer firstly calculates coefficients of fluctuation $$S1_{h2} = \frac{\max(h2) - \min(h2)}{\overline{h2}}, S2_{h2} = \left|\frac{h2_m}{\overline{h2}}\right|,$$

$$S1_{q1} = \frac{\max(q1) - \min(q1)}{\overline{q1}}, \text{ and } S2_{q1} = \left|\frac{q1_m}{\overline{q1}}\right|$$

of the arrays h2 and q1, wherein max(h2) is the maximum value in the array h2, min(h2) is the minimum value in the array h2, $$\overline{h2} = \frac{\sum_{i=1}^{n} h2_i}{n}$$

and $h2_m$ is the median of the array h2, max(q1) is the maximum value in the array q1, min(q1) is the minimum value in the array q1, $$\overline{q1} = \frac{\sum_{i=1}^{n} q1_i}{n}$$

and $q1_m$ is the median of the array q1.

When the coefficients of fluctuation $S1_{h2}$, $S2_{h2}$, $S1_{q1}$, and $S2_{q1}$ satisfy all the conditions $S1_{h2} \leq 6\%$, $97\% \leq S2_{h2} \leq 103\%$, $S1_{q1} \leq 3\%$, and $98\% \leq S2_{q1} \leq 102\%$, the computer processes the arrays I2 and h2, respectively acquires through calculation the mean values $$\overline{I2} = \frac{\sum_{i=1}^{n} I2_i}{n} \text{ and } \overline{h2} = \frac{\sum_{i=1}^{n} h2_i}{n}$$

of the arrays I2 and h2, and outputs $\overline{I2}$ and $\overline{h2}$ as the real-time current value and the real-time liquid level height of this spray test respectively. When the coefficients of fluctuation $S1_{h2}$, $S2_{h2}$, $S1_{q1}$, and $S2_{q1}$ fail to satisfy all the conditions $S1_{h2} \leq 6\%$, $97\% \leq S2_{h2} \leq 103\%$, $S1_{q1} \leq 3\%$, and $98\% \leq S2_{q1} \leq 102\%$, the computer still outputs $\overline{I2}$ and $\overline{h2}$ as the real-time current value and the real-time liquid level height of this spray test respectively, and meanwhile, outputs the coefficients of fluctuation $S1_{h2}$, $S2_{h2}$, $S1_{q1}$, and $S2_{q1}$ synchronously for the reference of testers.

During the test, the computer system calculates the charge-to-mass ratio parameter of the electrostatic atomization nozzle according to the real-time current value and the real-time liquid level height output in the spray test. The charge-to-mass ratio parameter is specifically calculated by using the following formula:

$$\varepsilon = k_1 \frac{\overline{I1}}{\rho d_1{}^2 \sqrt{g\overline{h1}}} = k_1 \frac{\overline{I2}}{\rho d_1{}^2 \sqrt{g\overline{h2}}}$$

wherein ε, in microcoulombs/kilogram, is the charge-to-mass ratio parameter of the electrostatic atomization nozzle; ρ, in kilograms/cubic meter, is the density of the liquid to be sprayed by the electrostatic atomization nozzle; $d_1$, in meters, is the inner diameter of the lower-cylinder water outlet pipe; g, in meters/second squared, is gravitational acceleration; $k_1$ is modification coefficient, $k_1$=1080-1120; $\overline{I1}$ and $\overline{I2}$, in amperes, are real-time current values during the test of the measurement system; $\overline{h1}$ and $\overline{h2}$, in meters, are real-time liquid level heights during the test of the measurement system.

What is claimed is:

1. A system for measuring a charge-to-mass ratio of an electrostatic atomization nozzle, comprising: the electrostatic atomization nozzle, an insulating bracket, an upper cylinder, a water retaining ring, a vortex breaker, a flow regulating plate, a lower cylinder, a lower-cylinder water outlet pipe, an ammeter, a metal conducting wire, a liquid level tube, an ultrasonic level meter, a water storage tank, a water supply pipe, a liquid pump, a branch pipeline, a pressure regulating valve, a throttle valve, a filter, a flowmeter, and a computer, wherein the upper cylinder is formed by circumferentially connecting a gradually expanding upper-cylinder end cover and a thin-walled columnar upper-cylinder main body, a lower end of the upper cylinder is an opening, an upper end of the upper cylinder is the upper-cylinder end cover, and an end-cover central hole is provided at a center of the upper-cylinder end cover; the lower cylinder is formed by circumferentially welding a thin-walled columnar lower-cylinder main body and a gradually reducing lower-cylinder bottom cover, an upper end of the lower cylinder is an opening, and a lower end of the lower-cylinder bottom cover is connected to the lower-cylinder water outlet pipe; the upper cylinder and the lower cylinder are connected through an upper-cylinder flange and a lower-cylinder flange, thereby forming an internal cylindrical space with two open ends between the upper cylinder and the lower cylinder; the electrostatic atomization nozzle, the upper cylinder, and the lower cylinder are sequentially connected from top to bottom, and the electrostatic atomization nozzle is mounted in middle of the end-cover central hole and sprays charged droplets vertically downward; the ammeter is connected to the lower-cylinder flange through the metal conducting wire, and is capable of measuring in real time a current produced by the charged droplets sprayed by the electrostatic atomization nozzle into the lower cylinder; the charged droplets sprayed by the electrostatic atomization nozzle are gathered in the lower cylinder, and under influence of its own gravity, the liquid flows to the water storage tank through the lower-cylinder water outlet pipe, while a bottom end of the water storage tank is communicated with the water supply pipe and the liquid pump, enabling the liquid in the water storage tank to be delivered by the liquid pump to an inlet of the electrostatic atomization nozzle and again sprayed into the lower cylinder by the electrostatic atomization nozzle; the water supply pipe is communicated with the branch pipeline, and a part of the liquid delivered by the liquid pump flows back to the water storage tank through the branch pipeline; the liquid level tube is L-shaped and consists of a horizontal short tube and a vertical long tube which have thin-walled round tubular structures, the horizontal short tube is communicated with the lower cylinder, and the ultrasonic level meter is mounted on an upper end of the vertical long tube and is capable of measuring in real time a liquid level height in the liquid level tube and the lower cylinder; the ammeter, the ultrasonic level meter, and the flowmeter are connected to the computer through data cables, and the computer acquires and processes in real time measurement data of the ammeter, the ultrasonic level meter, and the flowmeter, thereby achieving real-time measurement and monitoring of the charge-to-mass ratio parameter of the electrostatic atomization nozzle.

2. The system for measuring the charge-to-mass ratio of the electrostatic atomization nozzle according to claim 1, wherein the upper cylinder is fixed to a top fixing end through the insulating bracket, and an inner diameter of the upper-cylinder main body is equal to an inner diameter $D_1$ of the lower-cylinder main body; the water retaining ring is of a thin-walled columnar structure coaxial with the upper cylinder and is located in the upper cylinder, and an upper end surface of the water retaining ring is connected to a lower surface of the upper-cylinder end cover; an inner diameter of the water retaining ring is one half of the inner diameter $D_1$ of the lower-cylinder main body; several end-cover vent holes are provided on an edge of the upper-cylinder end cover, so that the internal cylindrical space formed between the upper cylinder and the lower cylinder is open to atmosphere, and the end-cover vent holes are uniformly distributed along a circumference of the edge of the upper-cylinder end cover; the insulating bracket, the upper cylinder, and the water retaining ring are made of an insulating material; the vortex breaker and the flow regulating plate are disposed in the lower-cylinder main body, the vortex breaker is of a crossed structure formed by flat steel bars, and the flow regulating plate is of a circular steel plate structure provided with circular flow-through holes; the vortex breaker and the flow regulating plate are sequentially and horizontally arranged in the lower-cylinder main body from top to bottom, and the liquid gathered in the lower cylinder passes through the vortex breaker and the flow regulating plate in process of flowing downward; the lower-cylinder flange is welded on an upper end surface of the lower-cylinder main body, the lower-cylinder flange and the upper-cylinder flange are matched and fixedly connected with each other, so that the upper cylinder and the lower cylinder are coaxially and fixedly connected, and a gasket is arranged between the lower-cylinder flange and the upper-cylinder flange to prevent leakage of the liquid; the lower cylinder and the lower-cylinder water outlet pipe are made of a metal material, and outer surfaces of the metal material are treated with polymer spraying to improve insulation performance from outside.

3. The system for measuring the charge-to-mass ratio of the electrostatic atomization nozzle according to claim 2, wherein a wall of the upper cylinder is 8-12 millimeters thick; the water retaining ring is 2-4 millimeters thick; the insulating material comprises rubber, polyethylene, polypropylene, or polyvinyl chloride; walls of the lower cylinder and the lower-cylinder water outlet pipe are 5-8 millimeters thick; the metal material for fabricating the lower cylinder and the lower-cylinder water outlet pipe comprises carbon steel, stainless steel, and aluminum alloys.

4. The system for measuring the charge-to-mass ratio of the electrostatic atomization nozzle according to claim 1, wherein the upper-cylinder main body and the lower-cylinder main body are of thin-walled columnar structures, and the lower-cylinder water outlet pipe is of a columnar short pipe structure, wherein an inner diameter $D_1$ of the lower-cylinder main body ranges from 0.3-0.6 meters, an inner diameter $d_1$ of the lower-cylinder water outlet pipe ranges from 0.001 meter-0.005 meters, and a length $L_1$ of the lower-cylinder water outlet pipe ranges from $4d_1$-$5d_1$, the lower-cylinder main body, the lower-cylinder bottom cover, and the lower-cylinder water outlet pipe are sequentially connected from top to bottom, and a height H of the lower cylinder is designed by using the following formula:

$$H = k_1 \frac{q^2}{g d_1^4}$$

wherein H, in meters, is the height of the lower cylinder;

q, in cubic meters/second, is designed spray flow of the measurement system;

g, in meters/second squared, is gravitational acceleration;

$d_1$, in meters, is the inner diameter of the lower-cylinder water outlet pipe;

$k_1$ is modification coefficient, $k_1$=1.6-2.4;

the flow regulating plate of a circular steel plate structure is horizontally arranged in the lower-cylinder main body, a certain number of circular flow-through holes are provided on a surface of the flow regulating plate, and a diameter $d_2$ of each of the circular flow-through holes, the number N of the circular flow-through holes, and the inner diameter $D_1$ of the lower-cylinder main body satisfy the following relationship:

$$0.4 << \frac{Nd_2^2}{D_1^2} << 0.6$$

wherein $d_2$, in meters, is the diameter of each of the circular flow-through holes;

N is the number of the circular flow-through holes;

$D_1$, in meters, is the inner diameter of the lower-cylinder main body.

5. The system for measuring the charge-to-mass ratio of the electrostatic atomization nozzle according to claim 1, wherein the liquid level tube is located on a side surface of the lower cylinder and consists of the horizontal short tube and the vertical long tube welded together, the horizontal short tube is horizontally arranged, and the vertical long tube is vertically arranged; a liquid level tube vent hole is provided on an upper end of the vertical long tube, so that the liquid level tube is open to atmosphere, and meanwhile, the horizontal short tube is communicated with the lower cylinder, thereby forming mutual communication between the liquid level tube, the lower cylinder, and the atmosphere, wherein a center of the liquid level tube vent hole is higher than an end surface of the lower-cylinder flange; the ultrasonic level meter is mounted on the upper end of the vertical long tube, a probe of the ultrasonic level meter faces vertically downward, and the ultrasonic level meter is capable of measuring in real time the liquid level height in the liquid level tube and the lower cylinder; the liquid level tube is made of a metal material, and an outer surface of the metal material is treated with polymer spraying; an input end of the ammeter is connected to an outer surface of the lower-cylinder flange through the metal conducting wire, and an output end of the ammeter is connected to a ground terminal; the water storage tank is a cylindrical vessel having a closed bottom end and an opening upper end and is located below the lower-cylinder water outlet pipe, the water storage tank is communicated with the inlet of the electrostatic atomization nozzle through the water supply pipe, the liquid pump, the throttle valve, the filter, and the flowmeter, and the flowmeter is located near the inlet of the electrostatic atomization nozzle and acquires in real time a spray flow of the electrostatic atomization nozzle; the water supply pipe is arranged between the liquid pump and the throttle valve and is connected to the branch pipeline; the pressure regulating valve is disposed on the branch pipeline and is capable of being controlled to adjust an output pressure of the liquid pump and a spray pressure of the electrostatic atomization nozzle; an outlet of the branch pipeline faces the opening upper end of the water storage tank, enabling a part of the liquid to flow back into the water storage tank through the branch pipeline and the pressure regulating valve; the water storage tank is made of the metal material, and the water supply pipe and the branch pipeline are made of an insulating material.

6. The system for measuring the charge-to-mass ratio of the electrostatic atomization nozzle according to claim 5, wherein the metal material for fabricating the liquid level tube and the water storage tank comprises carbon steel, stainless steel, and aluminum alloys; a wall of the liquid level tube is 4-6 millimeters thick and is not thicker than that of the lower cylinder; the ammeter is selected from a microammeter or picoammeter; the insulating material for fabricating the water supply pipe and the branch pipeline comprises rubber, polyethylene, polypropylene, or polyvinyl chloride.

7. The system for measuring the charge-to-mass ratio of the electrostatic atomization nozzle according to claim 1, wherein the measurement system has the following two working modes:

a first working mode, being used for measuring the charge-to-mass ratio parameter of the electrostatic atomization nozzle of an electrostatic sprayer in a working state, and in this case, the electrostatic sprayer is directly connected to the electrostatic atomization nozzle, the electrostatic atomization nozzle is a part of the electrostatic sprayer, and during a spray test, the electrostatic sprayer provides the electrostatic atomization nozzle with the liquid to be sprayed; when the charge-to-mass ratio parameter of the electrostatic atomization nozzle is measured in the first working mode, the liquid pump, the pressure regulating valve, and the throttle valve are in a closed state; and a second working mode, wherein the electrostatic atomization nozzle functions as an independent component to be measured and is not connected to an external electrostatic sprayer, the liquid is driven by the liquid pump to flow in closed circulation in the electrostatic atomization nozzle, the lower cylinder, the lower-cylinder water outlet pipe, the water storage tank, and the water supply pipe, so that the electrostatic atomization nozzle is continuously supplied with the liquid to be sprayed and proceeding of the spray test is ensured, and meanwhile, the pressure regulating valve is controlled to adjust an output pressure of the liquid pump and a spray pressure of the electrostatic atomization nozzle, to realize measurement of the charge-to-mass ratio parameter under different spray pressures; when the charge-to-mass ratio parameter of the electrostatic atomization nozzle is measured in the second working mode, the liquid pump, the pressure regulating valve, and the throttle valve are in an open state.

8. A measurement method using the system for measuring the charge-to-mass ratio of the electrostatic atomization nozzle according to claim 7, wherein when the measurement system is in the first working mode, the computer acquires in real time the measurement data of the ammeter and the ultrasonic level meter, and the measurement method comprises specifically the following steps:

during a spray test of the electrostatic atomization nozzle, acquiring, by the computer, in real time data of a current I output by the ammeter according to a sampling period $T_1$ of the ammeter, and acquiring in real time data of a liquid level height h output by the ultrasonic level meter according to a sampling period $T_2$ of the ultrasonic level meter, a sampling duration of the computer being t1 ranging from 30T-50T, wherein T is a larger value of $T_1$ and $T_2$;

during a system test, acquiring, by the computer, data of the current I and the liquid level height h within the sampling duration t1 to respectively generate arrays $I1=[I1_1, I1_2, \ldots, I1_n]$ and $h1=[h1_1, h1_2, \ldots, h1_n]$; firstly calculating, by the computer, coefficients of fluctuation $$S1_{h1} = \frac{\max(h1) - \min(h1)}{\overline{h1}} \text{ and } S2_{h1} = \left| \frac{h1_m}{\overline{h1}} \right|,$$

wherein max(h1) is a maximum value in the array h1, min(h1) is a minimum value in the array h1, $$\overline{h1} = \frac{\sum_{i=1}^{n} h1_i}{n},$$

and $h1_m$ is a median of the array h1;

when the coefficients of fluctuation $S1_{h1}$ and $S2_{h1}$ satisfy both conditions $S1_{h1} \leq 6\%$ and $97\% \leq S2_{h1} \leq 103\%$, processing, by the computer, the arrays I1 and h1, respectively acquiring through calculation mean values $$\overline{I1} = \frac{\sum_{i=1}^{n} I1_i}{n} \text{ and } \overline{h1} = \frac{\sum_{i=1}^{n} h1_i}{n}$$

of the arrays I1 and h1, and outputting $\overline{I1}$ and $\overline{h1}$ as a real-time current value and a real-time liquid level height of this spray test respectively;

when the coefficients of fluctuation $S1_{h1}$ and $S2_{h1}$ fail to satisfy both the conditions $S1_{h1} \leq 6\%$ and $97\% \leq S2_{h1} \leq 103\%$, still outputting, by the computer, $\overline{I1}$ and $\overline{h1}$ as the real-time current value and the real-time liquid level height of this spray test respectively, and meanwhile, outputting the coefficients of fluctuation $S1_{h1}$ and $S2_{h1}$ synchronously for reference of testers; and when the measurement system is in the second working mode, the computer acquires in real time the measurement data of the ammeter, the ultrasonic level meter, and the flowmeter, and the measurement method comprises specifically the following steps:

during the spray test of the electrostatic atomization nozzle, acquiring, by the computer, in real time data of the current I output by the ammeter according to the sampling period $T_1$ of the ammeter, acquiring in real time data of the liquid level height h output by the ultrasonic level meter according to the sampling period $T_2$ of the ultrasonic level meter, and acquiring in real time data of the spray flow q output by the flowmeter according to a sampling period $T_3$ of the flowmeter, the sampling duration of the computer being t2 ranging from 30T-50T, wherein T is the maximum value of $T_1$, $T_2$, and $T_3$;

during the system test, acquiring, by the computer, the data of the current I, the liquid level height h, and the spray flow q within the sampling duration t2 to respectively generate arrays $I2=[I2_1, I2_2, \ldots, I2_n]$, $h2=[h2_1, h2_2, \ldots, h2_n]$, and $q1=[q1_1, q1_2, \ldots, q1_n]$; firstly calculating, by the computer, coefficients of fluctuation $$S1_{h2} = \frac{\max(h2) - \min(h2)}{\overline{h2}}, S2_{h2} = \left| \frac{h2_m}{\overline{h2}} \right|,$$

$$S1_{q1} = \frac{\max(q1) - \min(q1)}{\overline{q1}}, \text{ and } S2_{q1} = \left| \frac{q1_m}{\overline{q1}} \right|$$

of the arrays h2 and q1, wherein max(h2) is the maximum value in the array h2, min(h2) is the minimum value in the array h2, $$\overline{h2} = \frac{\sum_{i=1}^{n} h2_i}{n}$$

and $h2_m$ is the median of the array h2, max(q1) is the maximum value in the array q1, min(q1) is the minimum value in the array q1, $$\overline{q1} = \frac{\sum_{i=1}^{n} q1_i}{n}$$

and $q1_m$ is the median of the array q1;

when the coefficients of fluctuation $S1_{h2}$, $S2_{h2}$, $S1_{q1}$, and $S2_{q1}$ satisfy all the conditions $S1_{h2} \leq 6\%$, $97\% \leq S2_{h2} \leq 103\%$, $S1_{q1} \leq 3\%$, and $98\% \leq S2_{q1} \leq 102\%$, processing, by the computer, the arrays I2 and h2, respectively acquiring through calculation the mean values $$\overline{I2} = \frac{\sum_{i=1}^{n} I2_i}{n} \text{ and } \overline{h2} = \frac{\sum_{i=1}^{n} h2_i}{n}$$

of the arrays I2 and h2, and outputting $\overline{I2}$ and $\overline{h2}$ as the real-time current value and the real-time liquid level height of this spray test respectively;

when the coefficients of fluctuation $S1_{h2}$, $S2_{h2}$, $S1_{q1}$, and $S2_{q1}$ fail to satisfy all the conditions $S1_{h2} \leq 6\%$, 97%≤$S2_{h2}$≤103%, $S1_{q1}$≤3%, and 98%≤$S2_{q1}$≤102%, still outputting, by the computer, $\overline{I2}$ and $\overline{h2}$ as the real-time current value and the real-time liquid level height of this spray test respectively, and meanwhile, outputting the coefficients of fluctuation $S1_{h2}$, $S2_{h2}$, $S1_{q1}$, and $S2_{q1}$ synchronously for the reference of testers.

9. The method according to claim 8, wherein when the measurement system is in the first working mode or the second working mode, the computer system calculates the charge-to-mass ratio parameter of the electrostatic atomization nozzle according to the real-time current value and the real-time liquid level height output in the spray test, and the charge-to-mass ratio parameter is specifically calculated by using the following formula:

$$\varepsilon = k_1 \frac{\overline{I1}}{\rho d_1^2 \sqrt{g\overline{h1}}} = k_1 \frac{\overline{I2}}{\rho d_1^2 \sqrt{g\overline{h2}}}$$

wherein $\varepsilon$, in microcoulombs/kilogram, is the charge-to-mass ratio parameter of the electrostatic atomization nozzle;

$\rho$, in kilograms/cubic meter, is the density of the liquid to be sprayed by the electrostatic atomization nozzle;

$d_1$, in meters, is the inner diameter of the lower-cylinder water outlet pipe;

g, in meters/second squared, is gravitational acceleration;

$k_1$ is modification coefficient, $k_1$=1080-1120;

$\overline{I1}$ and $\overline{I2}$, in amperes, are real-time current values during the test of the measurement system;

$\overline{h1}$ and $\overline{h2}$, in meters, are real-time liquid level heights during the test of the measurement system.

\* \* \* \* \*